(12) United States Patent
Shepard

(10) Patent No.: US 8,766,227 B1
(45) Date of Patent: Jul. 1, 2014

(54) PINCHED CENTER RESISTIVE CHANGE MEMORY CELL

(75) Inventor: Daniel R. Shepard, North Hampton, NH (US)

(73) Assignee: Contour Semiconductor, Inc., Billerica, MA (US)

( * ) Notice: Subject to any disclaimer, the term of this patent is extended or adjusted under 35 U.S.C. 154(b) by 0 days.

(21) Appl. No.: 13/373,205

(22) Filed: Nov. 8, 2011

Related U.S. Application Data

(60) Provisional application No. 61/456,732, filed on Nov. 10, 2010.

(51) Int. Cl.
*H01L 29/04* (2006.01)
*H01L 29/792* (2006.01)

(52) U.S. Cl.
CPC ................................... *H01L 29/792* (2013.01)
USPC ............................................................ 257/2

(58) Field of Classification Search
CPC .................................................... H01L 29/792
USPC ...................................... 257/2, 315, 326, 3–4
See application file for complete search history.

(56) References Cited

U.S. PATENT DOCUMENTS

| | | | | |
|---|---|---|---|---|
| 2007/0263354 A1* | 11/2007 | Crocker et al. | ............... | 361/699 |
| 2007/0267621 A1* | 11/2007 | Ufert | ................. | 257/4 |
| 2009/0072341 A1* | 3/2009 | Liu et al. | ........................ | 257/506 |
| 2009/0090965 A1* | 4/2009 | Kito et al. | ........................ | 257/326 |
| 2009/0108333 A1* | 4/2009 | Kito et al. | ........................ | 257/324 |
| 2009/0146208 A1* | 6/2009 | Ban et al. | ........................ | 257/326 |
| 2009/0230450 A1* | 9/2009 | Shiino et al. | ................... | 257/314 |
| 2009/0230458 A1* | 9/2009 | Ishiduki et al. | ............... | 257/324 |
| 2009/0230459 A1* | 9/2009 | Kito et al. | ........................ | 257/324 |
| 2009/0321815 A1* | 12/2009 | Sung et al. | ..................... | 257/324 |
| 2010/0078741 A1* | 4/2010 | Zheng et al. | .................. | 257/421 |
| 2010/0096610 A1* | 4/2010 | Wang et al. | ....................... | 257/2 |

* cited by examiner

*Primary Examiner* — Nathan Ha
(74) *Attorney, Agent, or Firm* — Bingham McCutchen LLP

(57) ABSTRACT

A vertically oriented memory element having a narrower area near its center away from its ends is formed. Current density and heating are higher away from the ends of the memory element, thus increasing its lifetime.

16 Claims, 10 Drawing Sheets

PINCHED CENTER RESISTIVE CHANGE MEMORY CELL

CROSS-REFERENCE TO RELATED APPLICATIONS

This application claims priority to and benefit of U.S. Provisional Patent Application Ser. No. 61/456,732, filed on Nov. 10, 2010, which is incorporated herein by reference. This application makes reference to U.S. patent application Ser. No. 12/543,086 by Apodaca et. al. filed on Aug. 18, 2009 and titled "METHOD FOR FORMING SELF-ALIGNED PHASE-CHANGE SEMICONDUCTOR DIODE MEMORY", U.S. patent application Ser. No. 12/581,555 by Wang et. al. filed on Oct. 19, 2009 and titled "PHASE CHANGE MATERIAL MEMORY CELL" and these applications are incorporated herein by reference in their entirety.

TECHNICAL FIELD

In various embodiments, the present invention relates to storage elements as they relate to memory devices, and more particularly to resistive change information storage elements formed in cups for use in memory devices.

BACKGROUND

In diode decoded solid state memory, one generates memory cells through the formation of an information storage element in conjunction with a current steering element such as a P-N junction diode in amorphous, crystalline, or polycrystalline silicon. These diode memory cells are isolated from each other by embedding them in an insulating layer such as silicon nitride. With the utilization of resistive change or phase-change alloys as an information storage element, one can create a reversibly switching, re-programmable memory cell.

In order to utilize certain data storage materials, such as resistive change materials or phase-change materials such as a Chalcogenide alloy, a recess is formed adjacent to and above the diode memory cell. This recess allows the data storage material to be deposited immediately adjacent to the diode and function as an information storage switch. This is the approach outlined in U.S. patent application Ser. No. 12/543, 086. What is needed is a method for forming a vertically oriented element having a narrower area away from either end.

SUMMARY

The present invention is a variation on the information storage element portion of the memory cell as disclosed in U.S. patent application Ser. No. 12/543,086. The present invention will find applicability in other memory cell structures as well. The present invention is a method for forming a vertically oriented element having a narrower area near its center away from either end.

The present invention is a means for forming a vertically oriented information storage element wherein the storage element has a narrow portion towards its center such that the current density will be higher away from the ends of the element. In this way, the heating will occur away from the ends of the storage element. Heating in a phase-change or resistive change element leads to end of life conditions, including the condition whereby contaminants from the end point contacts are enabled to migrate away from the end point and into the storage element thereby contaminating the storage element material and reducing its ability to be programmed, erased and/or read back. By keeping the greatest heating towards the center of the element where it is surrounded by more of the same element material and away from the ends of the element where end point contact material can be heated and potentially activated, the lifetime of the element will be increased.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, an embodiment of the present invention is described with reference to the following drawing, in which.

DETAILED DESCRIPTION

Memory cells according to the present invention can be fabricated using standard techniques and equipment. With this approach, a pinched center information storage element can be fabricated with minimal process steps and without expensive photolithographic steps.

Figure 1:
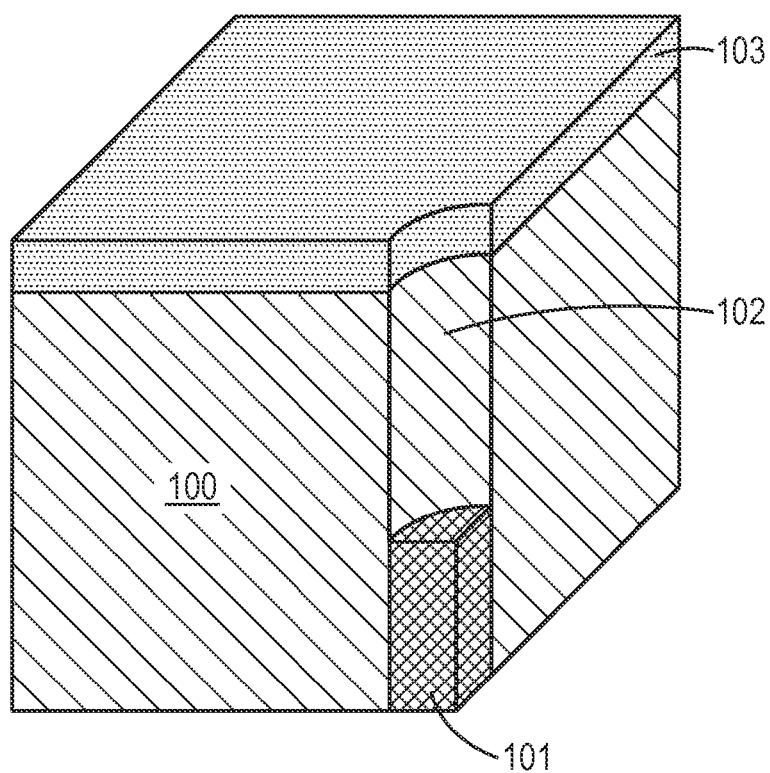
FIG. 1 is an exemplary drawing of a semiconductor memory cell in which the cup for holding the information storage element material has already been formed in accordance with an embodiment of the invention.

The present invention will find applicability wherever a vertically formed structure having a more narrow center region is required. In FIG. 1, a memory cell is depicted in its partially formed state; the switching or current steering device 101 is shown having an open cup 102 above into which the information storage element is to be formed. The surrounding dielectric material should be made of material that will not react with and thereby contaminate the resulting information storage element material. For example, with a Chalcogenide alloy such as GST, silicon nitride is a suitable choice. This structure can be formed as described in to U.S. patent application Ser. No. 12/543,086 by Apodaca et. al. or in U.S. patent application Ser. No. 12/581,555 by Wang et. al. or in a variety of other ways well known and understood by those skilled in the art. Typically, a hard mask material 103 will be patterned photographically and etched as a tall hole into which the switching or current steering device 101 is deposited or grown and etched back to form the structure depicted.

Figure 2:
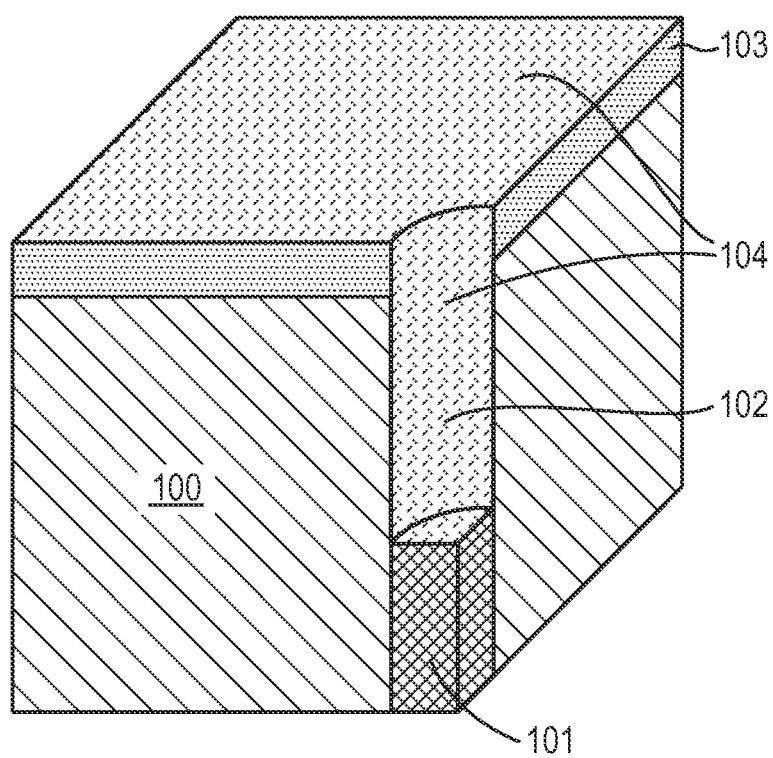
FIG. 2 is an exemplary drawing of a semiconductor memory cell in which the cup for holding the information storage element material has had an adhesion layer deposited therein in accordance with an embodiment of the invention.
Figure 3:
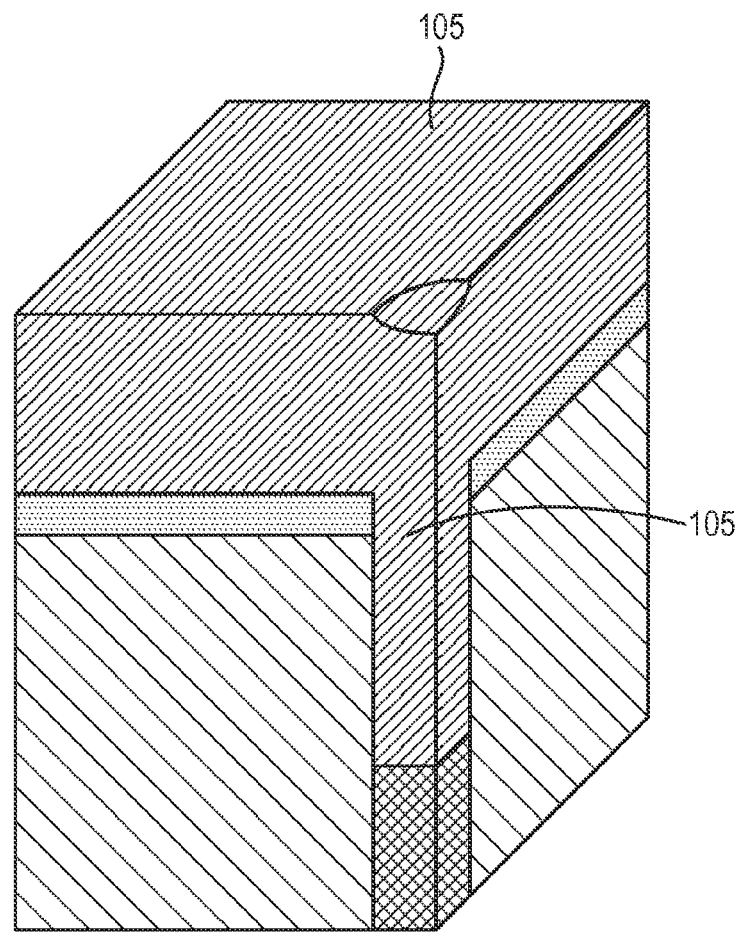
FIG. 3 is an exemplary drawing of a semiconductor memory cell in which the cup for holding the information storage element material has been filled with resistance change or phase-change material in accordance with an embodiment of the invention.
Figure 4:
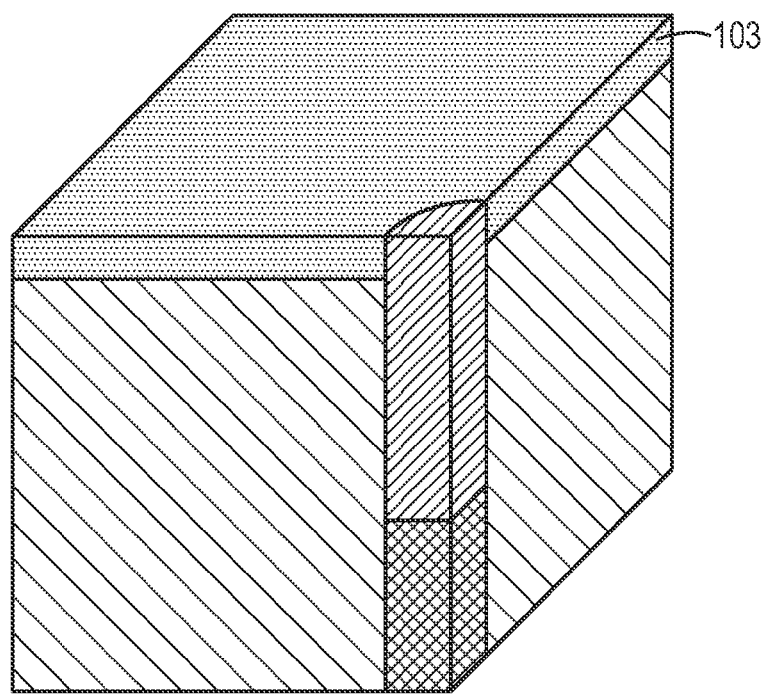
FIG. 4 is an exemplary drawing of a semiconductor memory cell in which the resistance change or phase-change material fill in the cup for holding the information storage element material has been planarized in accordance with an embodiment of the invention.
Figure 5:
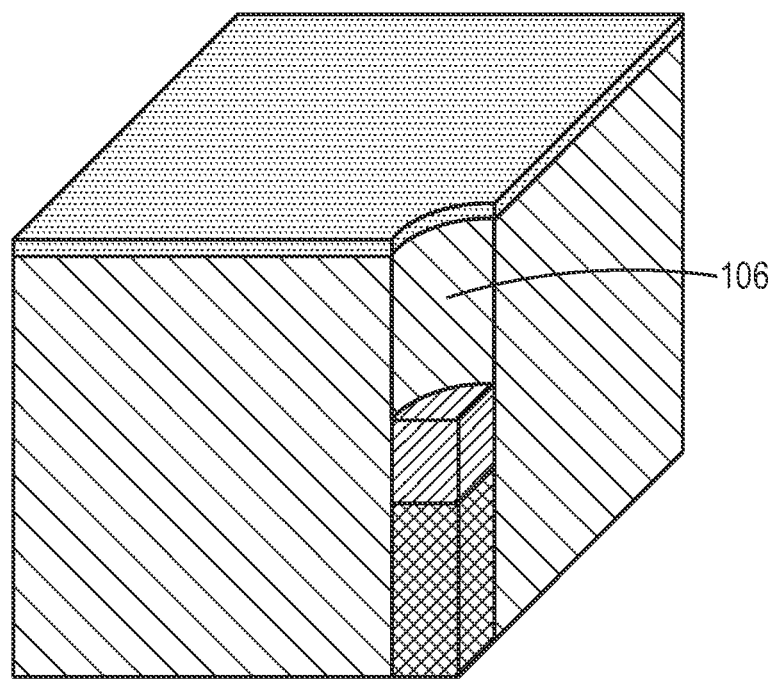
FIG. 5 is an exemplary drawing of a semiconductor memory cell in which the resistance change or phase-change material fill in the cup for holding the information storage element material has been etched back to reduce its height and reform another cup above it in accordance with an embodiment of the invention.

Once the initial cup 102 is formed, the cup is optionally lined with a material 104 (by Atomic Layer Deposition, ALD, or other technique such as CVD) for providing a barrier layer or adhesion layer. For example, titanium (Ti) makes a good adhesion layer and can be deposited in a thickness of 10 Å to 40 Å, as depicted in FIG. 2. This is followed by the deposition of a resistive change or phase-change material 105 so as to fill the cup as depicted in FIG. 3. This resistive change or phase-change material 105 is then planarized as depicted in FIG. 4 (the hard mask material 103 can be utilized as a polish stopping material). A secondary cup in now formed by etching (e.g., reactive ion etching) utilizing the hard mask material as an etch mask that has greater selectivity (i.e., etch resistance) than the resistive change or phase-change material 105. The secondary cup 106 is now formed as is depicted in FIG. 5. This secondary cup forming etch could be run for a longer duration while omitting the planarizing step (thereby running the process from FIG. 3 directly to FIG. 5 without FIG. 4).

Figure 6:
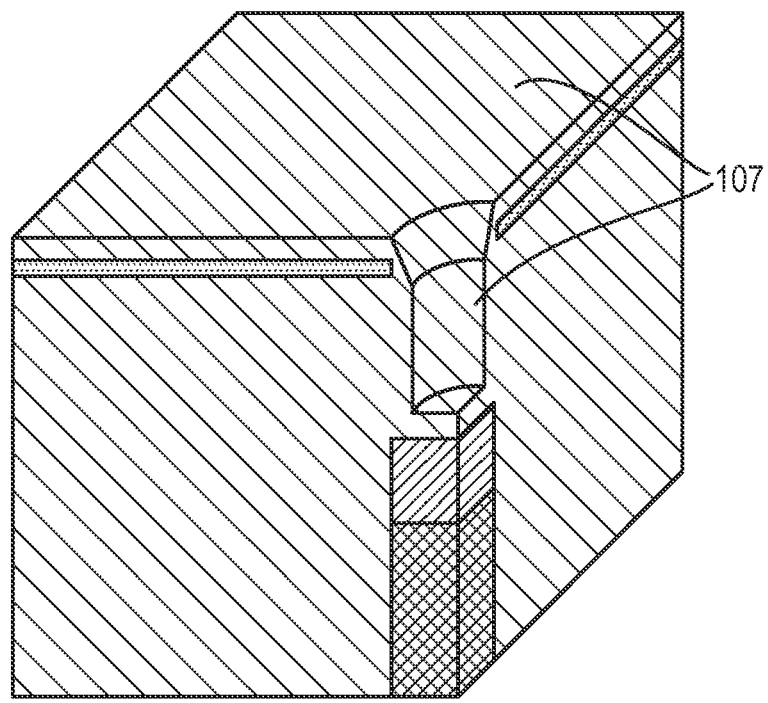
FIG. 6 is an exemplary drawing of a semiconductor memory cell in which the reformed cup for holding the information storage element material has had a conformal silicon nitride sidewall spacer layer deposited therein in accordance with an embodiment of the invention.
Figure 7:
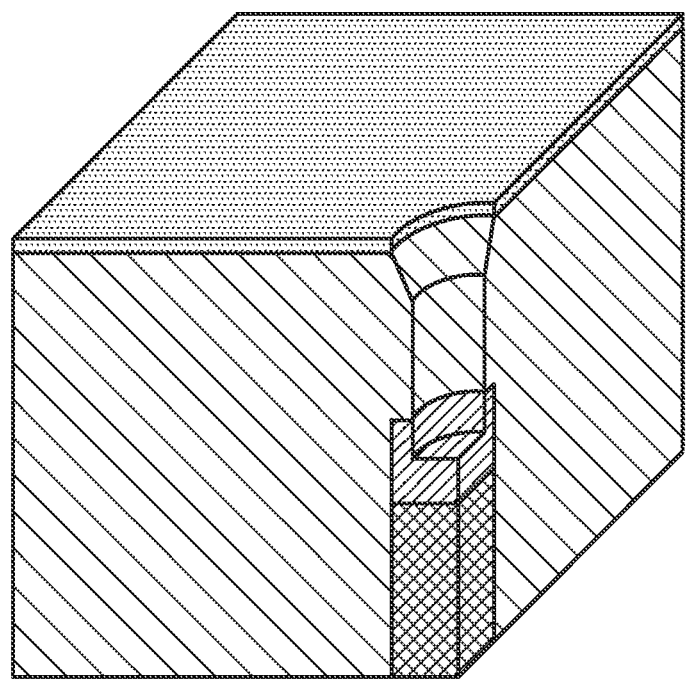
FIG. 7 is an exemplary drawing of a semiconductor memory cell in which the conformal silicon nitride sidewall spacer has been etched back so as to remove the sidewall spacer material from the bottom of the cup and to reduce its height on the sidewall in accordance with an embodiment of the invention.
Figure 8:
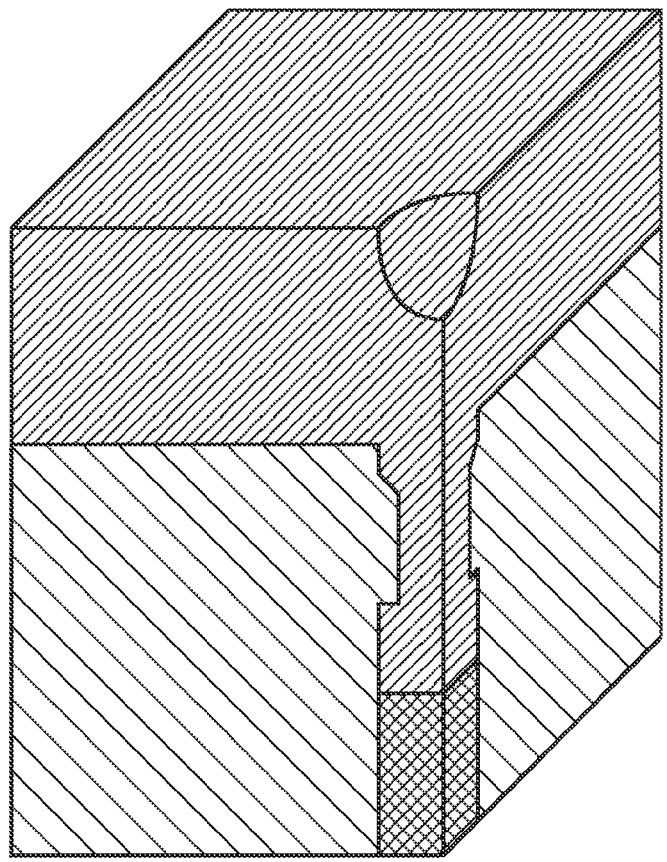
FIG. 8 is an exemplary drawing of a semiconductor memory cell in which the reformed cup for holding the information storage element material has been re-filled with resistance change or phase-change material in accordance with an embodiment of the invention.
Figure 9:
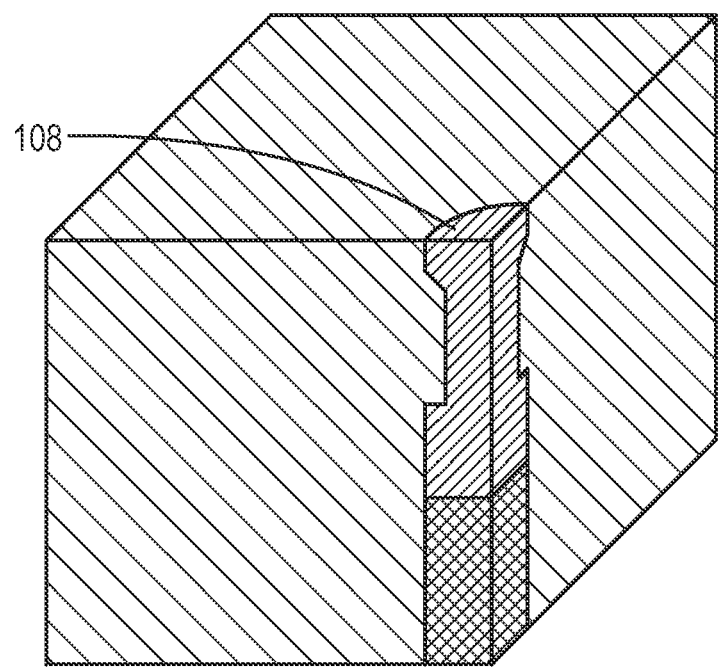
FIG. 9 is an exemplary drawing of a semiconductor memory cell in which the re-filled resistance change or phase-change material in the cup for holding the information storage element material has been planarized in accordance with an embodiment of the invention.

Having formed the secondary cup 106, processing proceeds in a maner similar to that described in U.S. patent application Ser. No. 12/543,086 by Apodaca et. al. or in U.S. patent application Ser. No. 12/581,555 by Wang et. al. Into the cup, a narrowing sidewall spacer is formed and the balance of the cup volume is filled with resistive change or phase-change material. FIG. 6 depicts the cup following a sidewall spacer deposition of a sidewall spacer material 107 such as silicon nitride as is well understood by those skilled in the art of MOS transistor fabrication. This sidewall spacer material is then etched back so as to clear the bottom of the cup and to lower the height of the resulting side wall spacer as depicted in FIG. 7 and as is well understood by those skilled in the art of MOS transistor fabrication. The lowering of the sidewall spacer height is done to provide the wider end point contact on the top of the information storage element. Finally, the structure is filled with more resistive change or phase-change material (FIG. 8) and polished (FIG. 9) to result in an information storage element having a narrower center region. The exposed top contact 108 would then be electrically wired in with traditional techniques for forming metal interconnects. Many storage elements (as would be the case with a memory array) would typically be formed in parallel (only one such cell is depicted in the Figures). The technique could be repeated in each layer in the case of three dimensional arrays.

Figure 10:
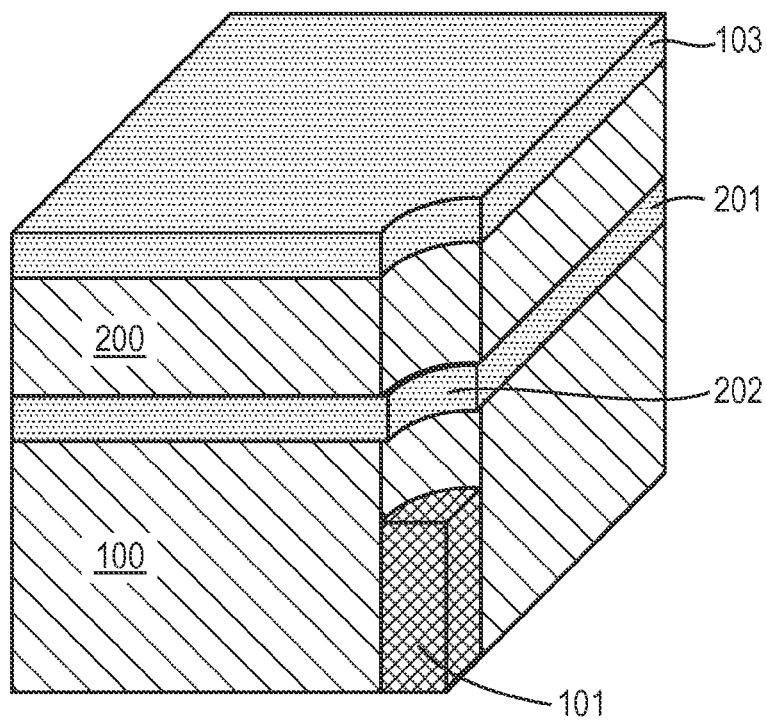
FIG. 10 is an exemplary drawing of a variation on a semiconductor memory cell in which the cup for holding the information storage element material has been formed in a series of layers in which a middle layer is more slowly etched than a top and bottom layer in accordance with an embodiment of the invention.
Figure 11:
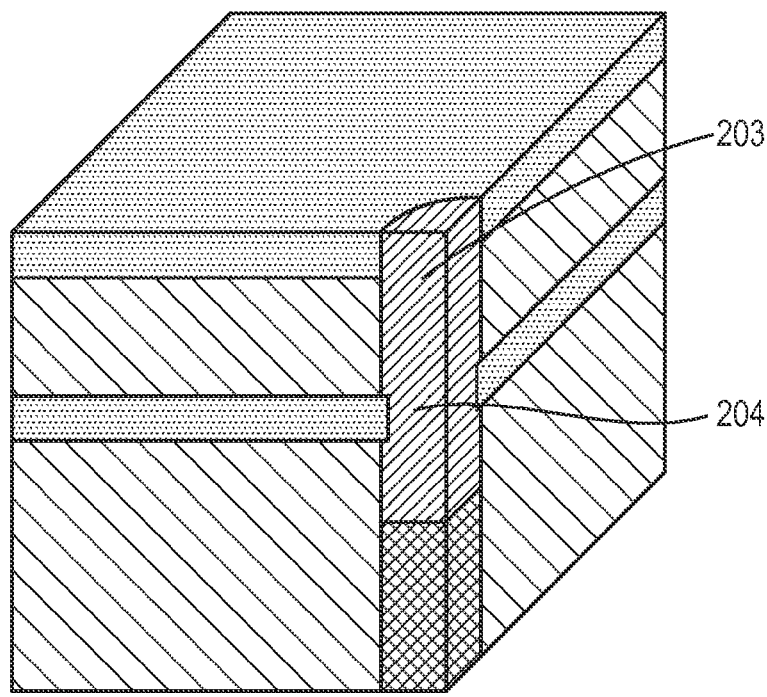
FIG. 11 is an exemplary drawing of a variation on a semiconductor memory cell in which the filled resistance change or phase-change material in the cup for holding the information storage element material has a narrowing that is away from either of its ends in accordance with an embodiment of the invention.

As depicted in FIG. 10, a variation on the invention would include placing a layer of a second dielectric material 201 in the surrounding dielectric material 100 & 200 in which the initial cup is formed such that this second dielectric material is positioned at about the level where the narrowing of the information storage element is desired. In other words, the cross-section of the volume of the cup is narrower near the center (i.e., away from the ends) than the cross-section of the ends. Such a cup would be formed with a directional etch as described above for FIG. 1. Once the cup is etched (or during the last portion of the etch to form the cup) a non-directional etch is utilized; this etch will be selective to remove the layer of second dielectric material more slowly than the dielectric material above and below that second dielectric material so as to widen the cup above and below this layer of second dielectric material. The resulting cup will have a narrower portion 202 away from the top end and the bottom end of the cup. This hour-glass shaped cup will now be conformally filled (i.e., by MOCVD) with the memory element material 203 and then planarized leaving a memory element having a narrow portion 204 away from its ends, as depicted in FIG. 11. Ideally, this second dielectric material 201 would be selected for its compatibility with the memory element material, particularly with the portion of the memory element material that would undergo change when the state of the information storage element is changed; for example, with a phase-change material such as a Chalcogenide alloy like GST, silicon nitride (SiNx) can be used (in which case the surrounding dielectric material 100 & 200 could be silicon dioxide (SiO2). Other material selections are possible. Reactive ion etches that will etch SiO2 faster than SiNx and which can be adjusted to be either directional or non-directional are well known to those skilled in the art.

Embodiments of the present invention for the purpose of memory device implementation will typically, though not necessarily, be built as integrated circuits. Embodiments may be implemented with a traditional two dimensional arrangement of storage elements or with a three-dimensional arrangement of storage elements. The storage elements could include a phase-change material (for PRAM) such as a chalcogenide alloy material (including a chalcogenide in which the programmed resistivity may be one of two resistance values and, in the case of more than one bit per cell storage cells, in which the programmed resistivity may be one of three or more resistance values) or a resistive change material (for RRAM), as well as a ferroelectric material (for FRAM), a magnetic or magnetoresistive material (for MRAM), magnetic tunnel junction or spin-transfer torque element (for MTJ-RAM or STT-RAM), a dual layer oxide memory element comprising a junction and an insulating metal oxide and a conductive metal oxide (see U.S. Pat. No. 6,753,561 by Rinerson), or a trapped charge device (see U.S. Pat. No. 7,362,609 by Harrison, et al). The phase-change material, such as a Chalcogenide material (e.g., GST or any of many alloy variants of GST), may be programmed or erased. The polarity of the voltages and direction of the currents in the storage bits may be reversed while still keeping within what is envisioned by embodiments of the present invention. The present invention may be applied to other memory technologies as well including static RAM, Flash memory, EEPROM, DRAM, and others not mentioned, including information storage element materials yet to be commercialized or invented.

Memory devices incorporating embodiments of the present invention may be applied to memory devices and systems for storing digital text, digital books, digital music (such as MP3 players and cellular telephones), digital audio, digital photographs (wherein one or more digital still images may be stored including sequences of digital images), digital video (such as personal entertainment devices), digital cartography (wherein one or more digital maps can be stored, such as GPS devices), and any other digital or digitized information as well as any combinations thereof. Devices incorporating embodiments of the present invention may be embedded or removable, and may be interchangeable among other devices that can access the data therein. Embodiments of the invention may be packaged in any variety of industry-standard form factor, including Compact Flash, Secure Digital, MultiMedia Cards, PCMCIA Cards, Memory Stick, any of a large variety of integrated circuit packages including Ball Grid Arrays, Dual In-Line Packages (DIPs), SOICs, PLCC, TQFPs and the like, as well as in proprietary form factors and custom designed packages. These packages may contain just the memory chip, multiple memory chips, one or more memory chips along with other logic devices or other storage devices such as PLDs, PLAs, micro-controllers, microprocessors, controller chips or chip-sets or other custom or standard circuitry.

The terms and expressions employed herein are used as terms and expressions of description and not of limitation, and there is no intention, in the use of such terms and expressions, of excluding any equivalents of the features shown and described or portions thereof. The present disclosure has been simplified at points for the sake of clarity, but these simplifications will be well understood by those skilled in the art. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A memory cell comprising:
a substrate comprising one or more dielectric materials;
disposed within the substrate, a current-steering element; and
disposed within the substrate and above and in contact with the current steering-element, an information storage element, the information storage element comprising a programmable data-storage material shaped to define (i) a first end region, (ii) a center region disposed over the first end region, and (iii) a second end region disposed over the center region,
wherein (i) a cross-sectional area of the center region is smaller than a cross-sectional area of the first end region, (ii) the cross-sectional area of the center region is smaller than a cross-sectional area of the second end region, (iii) the data-storage material comprises a phase-change material or a resistive-change material, and (iv) the data-storage material is configured for programmability via the current-steering element such that (a) a current density within the center region is larger than a current density within the first end region and (b) the current density within the center region is larger than a current density within the second end region.

2. The memory cell of claim 1, wherein the substrate comprises (i) a first material surrounding the center region of the information storage element and (ii) a second material surrounding the first and second end regions of the information storage element, the second material being different from the first material.

3. The memory cell of claim 2, wherein the first material comprises a first dielectric material.

4. The memory cell of claim 3, wherein the second material comprises a second dielectric material different from the first dielectric material.

5. The memory cell of claim 2, wherein the first material comprises a nitride material.

6. The memory cell of claim 2, wherein the first material comprises silicon.

7. The memory cell of claim 2, wherein the first material comprises silicon nitride.

8. The memory cell of claim 2, wherein the second material comprises silicon dioxide.

9. The memory cell of claim 1, further comprising a liner material (i) surrounding at least a portion of the second end region of the information storage element and (ii) disposed between the second end region of the information storage element and the substrate.

10. The memory cell of claim 9, wherein the liner material comprises a metal.

11. The memory cell of claim 9, wherein the liner material comprises titanium.

12. The memory cell of claim 1, wherein the surrounding substrate is in conformal contact with the center region and first and second end regions of the information storage element.

13. The memory cell of claim 1, wherein a top surface of the second end region is substantially coplanar with a top surface of the substrate.

14. The memory cell of claim 1, wherein the data-storage material comprises a phase-change material.

15. The memory cell of claim 14, wherein the phase-change material comprises a chalcogenide material.

16. The memory cell of claim 1, wherein the data-storage material comprises a resistive-change material.

* * * * *